United States Patent
Yu et al.

(10) Patent No.: US 12,232,370 B2
(45) Date of Patent: *Feb. 18, 2025

(54) DISPLAY SUBSTRATE MOTHERBOARD AND PREPARATION METHOD THEREOF, DISPLAY SUBSTRATE AND PREPARATION METHOD THEREOF

(71) Applicants: Chengdu BOE Optoelectronics Technology Co., Ltd., Chengdu (CN); BOE TECHNOLOGY GROUP CO., LTD., Beijing (CN)

(72) Inventors: Jun Yu, Beijing (CN); Zhong Lu, Beijing (CN); Zhenrui Fan, Beijing (CN); Shuohua Chen, Beijing (CN); Zhaoyang Song, Beijing (CN); Chenlin Yin, Beijing (CN); Yongjie Tang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/473,538

(22) Filed: Sep. 25, 2023

(65) Prior Publication Data

US 2024/0016008 A1 Jan. 11, 2024

Related U.S. Application Data

(63) Continuation of application No. 16/964,423, filed as application No. PCT/CN2019/109032 on Sep. 29, 2019, now Pat. No. 11,818,922.

(51) Int. Cl.
*H10K 59/124* (2023.01)
*H10K 59/12* (2023.01)
(Continued)

(52) U.S. Cl.
CPC ........... *H10K 59/124* (2023.02); *H10K 71/00* (2023.02); *H10K 77/111* (2023.02);
(Continued)

(58) Field of Classification Search
CPC .... H10K 59/124; H10K 71/00; H10K 77/111; H10K 59/1201; H10K 2102/311;
(Continued)

(56) References Cited

U.S. PATENT DOCUMENTS 9,276,239 B2 3/2016 Park et al.
10,360,825 B1 * 7/2019 Wu .................... H01L 27/1218
(Continued)

FOREIGN PATENT DOCUMENTS

| CN | 103985823 A | 8/2014 |
| CN | 107681060 A | 2/2018 |
| CN | 109830621 A | 5/2019 |

OTHER PUBLICATIONS

International Search Report of PCT/CN2019/109032 in Chinese, mailed Jun. 28, 2020 with English translation.
(Continued)

*Primary Examiner* — J. E. Schoenholtz
(74) *Attorney, Agent, or Firm* — Collard & Roe, P.C.; William Collard

(57) ABSTRACT

An Organic Light-Emitting Diode display substrate and a preparation method thereof. The Organic Light-Emitting Diode display substrate includes: a first flexible organic layer; a first inorganic layer on the first flexible organic layer; a second flexible organic layer on the first inorganic layer; a pixel driving circuit layer on the second flexible organic layer; a light-emitting element layer on the pixel driving circuit layer, and a thickness of the first flexible organic layer is 5 μm-20 μm, a thickness of the first inorganic layer is 0.4 μm-0.5 μm, and a thickness of the second flexible organic layer is 5 μm-20 μm.

16 Claims, 5 Drawing Sheets

(51) Int. Cl.
   *H10K 71/00*   (2023.01)
   *H10K 77/10*   (2023.01)
   *H10K 102/00*  (2023.01)
(52) U.S. Cl.
   CPC .... *H10K 59/1201* (2023.02); *H10K 2102/311* (2023.02); *H10K 2102/351* (2023.02)
(58) Field of Classification Search
   CPC ........... H10K 2102/351; H10K 71/851; H10K 71/80; G09F 9/30
   See application file for complete search history.

(56) References Cited

U.S. PATENT DOCUMENTS

| | | | |
|---|---|---|---|
| 11,088,236 B2* | 8/2021 | Jeon | ...... H10K 59/126 |
| 11,818,922 B2* | 11/2023 | Yu | ............ H10K 71/00 |
| 2014/0051192 A1 | 2/2014 | Lee et al. | |
| 2014/0323006 A1 | 10/2014 | Song et al. | |
| 2020/0098842 A1* | 3/2020 | Jeon | ...... H10K 59/123 |
| 2020/0266369 A1 | 8/2020 | Xu et al. | |
| 2021/0104709 A1 | 4/2021 | Kishimoto | |
| 2021/0359269 A1* | 11/2021 | Seo | ........ H10K 59/60 |

OTHER PUBLICATIONS

Notice of Transmittal of the International Search Report of PCT/CN2019/109032 in Chinese, mailed Jun. 28, 2020.

Written Opinion of the International Searching Authority of PCT/CN2019/109032 in Chinese, mailed Jun. 28, 2020 with English translation.

U.S. Office Action in U.S. Appl. No. 16/964,423 dated Mar. 31, 2023.

U.S. Notice of Allowance in U.S. Appl. No. 16/964,423 dated Jul. 14, 2023.

* cited by examiner

DISPLAY SUBSTRATE MOTHERBOARD AND PREPARATION METHOD THEREOF, DISPLAY SUBSTRATE AND PREPARATION METHOD THEREOF

CROSS REFERENCE TO RELATED APPLICATIONS

The present application is a continuation application of U.S. patent application Ser. No. 16/964,423 filed on Jul. 23, 2020, which is a U.S. National Phase Entry of International Application No. PCT/CN2019/109032 filed Sep. 29, 2019. The above-identified applications are incorporated by reference herein in their entirety.

TECHNICAL FIELD

Embodiments of the present disclosure relate to a display substrate motherboard and a preparation method thereof, a display substrate and a preparation method thereof.

BACKGROUND

Organic Light-Emitting Diode (OLED) display panels have become a key development direction of a new generation of display devices due to series of advantages such as self-luminescence, high contrast, high definition, wide viewing angle, low power consumption, fast response speed, and low preparation costs, and thus have received more and more attention. An organic light-emitting diode display panel may be formed by using a large board preparation process, that is, functional structures of a plurality of display substrates are formed on one motherboard substrate, then a plurality of separate display substrates are formed by cutting the motherboard substrate, and then each separate display substrate is subjected to a subsequent preparation process.

SUMMARY

At least one embodiment of the present disclosure provides a display substrate motherboard, the display substrate motherboard comprises a base substrate, a first flexible organic layer on the base substrate, a first inorganic layer on the first flexible organic layer, a second flexible organic layer on the first inorganic layer, and a pixel driving circuit layer on the second flexible organic layer, the pixel driving circuit layer includes a plurality of pixel driving circuit portions respectively used for a plurality of display substrates, the plurality of pixel driving circuit portions are insulated from each other, an orthogonal projection of the second flexible organic layer on the base substrate is located inside an orthogonal projection of the first inorganic layer on the base substrate, and an orthogonal projection of each of the pixel driving circuit portions on the base substrate is located inside the orthogonal projection of the second flexible organic layer on the base substrate.

For example, in the display substrate motherboard provided by at least one embodiment of the present disclosure, the orthogonal projection of the second flexible organic layer on the base substrate is also located inside an orthogonal projection of the first flexible organic layer on the base substrate.

For example, in the display substrate motherboard provided by at least one embodiment of the present disclosure, an interval between at least one side edge of the orthogonal projection of the second flexible organic layer on the base substrate and a corresponding side edge of the orthogonal projection of the first flexible organic layer on the base substrate is greater than or equal to 0.2 mm.

For example, in the display substrate motherboard provided by at least one embodiment of the present disclosure, an orthogonal projection of the first flexible organic layer on the base substrate is located inside the orthogonal projection of the first inorganic layer on the base substrate.

For example, in the display substrate motherboard provided by at least one embodiment of the present disclosure, materials of the first flexible organic layer and the second flexible organic layer both include polyimide.

For example, in the display substrate motherboard provided by at least one embodiment of the present disclosure, a thickness of the first flexible organic layer is 5 µm-20 µm, a thickness of the first inorganic layer is 0.4 µm-2 µm, and a thickness of the second flexible organic layer is 5 µm-20 µm.

For example, in the display substrate motherboard provided by at least one embodiment of the present disclosure, the first inorganic layer includes a first inorganic sub-layer and a second inorganic sub-layer sequentially stacked on the first flexible organic layer, a material of the first inorganic sub-layer includes one or more of silicon oxide, silicon nitride or silicon oxynitride, and a material of the second inorganic sub-layer includes amorphous silicon.

For example, in the display substrate motherboard provided by at least one embodiment of the present disclosure, a total thickness of the first inorganic layer is 0.4 µm-2 µm, and a thickness of the second inorganic sub-layer is 1 nm-50 nm.

For example, the display substrate motherboard provided by at least one embodiment of the present disclosure further comprises a second inorganic layer on the second flexible organic layer and a third flexible organic layer on the second inorganic layer, and an orthogonal projection of the third flexible organic layer on the base substrate is located inside the orthogonal projection of the second flexible organic layer on the base substrate.

For example, in the display substrate motherboard provided by at least one embodiment of the present disclosure, the base substrate is a rigid substrate.

For example, the display substrate motherboard provided by at least one embodiment of the present disclosure further comprises a light-emitting element layer on the pixel driving circuit layer, the light-emitting element layer includes a plurality of light-emitting element portions respectively used for the plurality of display substrates, and the plurality of light-emitting element portions are respectively located on the plurality of pixel driving circuit portions.

At least one embodiment of the present disclosure provides a display substrate, the display substrate comprises a first flexible organic layer, a first inorganic layer on the first flexible organic layer, a second flexible organic layer on the first inorganic layer, a pixel driving circuit layer on the second flexible organic layer, and a light-emitting element layer on the pixel driving circuit layer, a thickness of the first flexible organic layer is 5 µm-20 µm, a thickness of the first inorganic layer is 0.4 µm-2 µm, and a thickness of the second flexible organic layer is 5 µm-20 µm.

At least one embodiment of the present disclosure provides a preparation method of a display substrate motherboard, the preparation method comprises: providing a base substrate, forming a first flexible organic layer on the base substrate, forming a first inorganic layer on the first flexible organic layer, forming a second flexible organic layer on the first inorganic layer, and forming a pixel driving circuit layer on the second flexible organic layer, the pixel driving circuit layer includes a plurality of pixel driving circuit portions respectively used for a plurality of display substrates; the plurality of pixel driving circuit portions are insulated from each other; an orthogonal projection of the second flexible organic layer on the base substrate is located inside an orthogonal projection of the first inorganic layer on the base substrate, and an orthogonal projection of each of the pixel driving circuit portions on the base substrate is located inside the orthogonal projection of the second flexible organic layer on the base substrate.

For example, in the preparation method of the display substrate motherboard provided by at least one embodiment of the present disclosure, the orthogonal projection of the second flexible organic layer on the base substrate is also located inside an orthogonal projection of the first flexible organic layer on the base substrate.

For example, in the preparation method of the display substrate motherboard provided by at least one embodiment of the present disclosure, an interval between at least one side edge of the orthogonal projection of the second flexible organic layer on the base substrate and a corresponding side edge of the orthogonal projection of the first flexible organic layer on the base substrate is greater than or equal to 0.2 mm.

For example, in the preparation method of the display substrate motherboard provided by at least one embodiment of the present disclosure, an orthogonal projection of the first flexible organic layer on the base substrate is located inside the orthogonal projection of the first inorganic layer on the base substrate.

For example, in the preparation method of the display substrate motherboard provided by at least one embodiment of the present disclosure, materials of the first flexible organic layer and the second flexible organic layer both include polyimide.

For example, in the preparation method of the display substrate motherboard provided by at least one embodiment of the present disclosure, a formation thickness of the first flexible organic layer is 5 μm-20 μm, a formation thickness of the first inorganic layer is 0.4 μm-2 μm, and a formation thickness of the second flexible organic layer is 5 μm-20 μm.

For example, in the preparation method of the display substrate motherboard provided by at least one embodiment of the present disclosure, the forming the first inorganic layer includes sequentially forming a first inorganic sub-layer and a second inorganic sub-layer on the first flexible organic layer, a material of the first inorganic sub-layer includes one or more of silicon oxide, silicon nitride and silicon oxynitride, and a material of the second inorganic sub-layer includes amorphous silicon.

For example, in the preparation method of the display substrate motherboard provided by at least one embodiment of the present disclosure, a total thickness of the first inorganic sub-layer is 0.4 μm-2 μm; and a formation thickness of the second inorganic sub-layer is 1 nm-50 nm.

At least one embodiment of the present disclosure provides a preparation method of a display substrate, the preparation method comprises: obtaining a display substrate motherboard by using any one of the above mentioned preparation methods, separating the first flexible organic layer from the base substrate, and cutting the display substrate motherboard to form a plurality of individual display substrates.

For example, in the preparation method of a display substrate provided by at least one embodiment of the present disclosure, the base substrate is separated from the first flexible organic layer by using a laser lift-off manner.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1A:
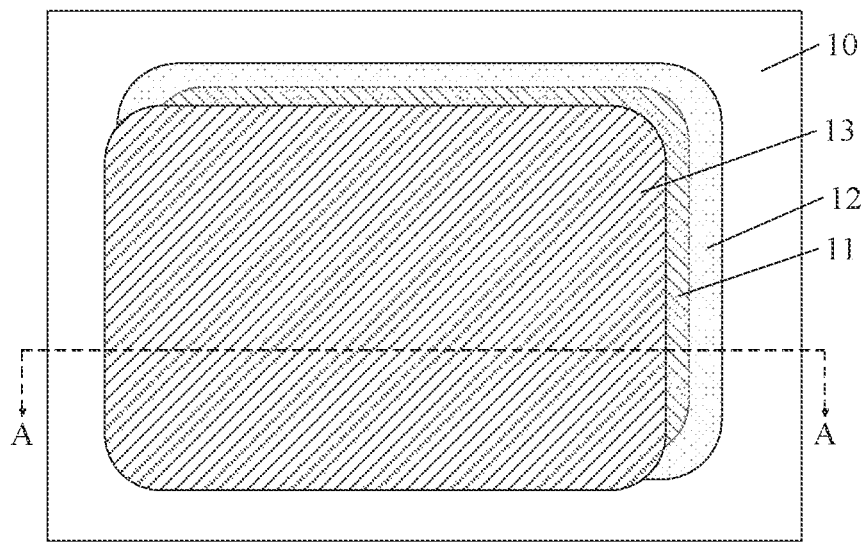
FIG. 1A is a planar schematic diagram of a motherboard substrate.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly. In one kind of a preparation process of an organic light-emitting diode display device, functional structures of a plurality of display substrates may be formed on one motherboard substrate to obtain a display substrate motherboard, and then a plurality of individual display substrates may be formed by cutting the display substrate motherboard. The mode may also be used for preparing a flexible display panel. FIG. 1A shows a planar schematic diagram of a motherboard substrate, and FIG. 1B shows a cross-sectional schematic diagram of the motherboard substrate shown in FIG. 1A along line A-A.

Figure 1B:
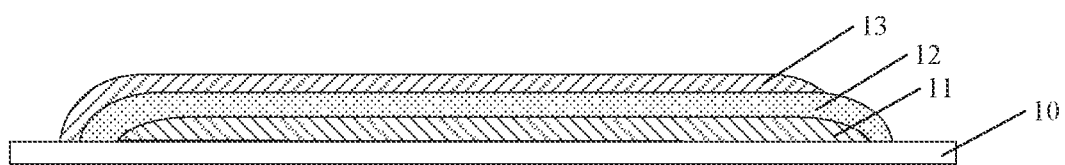
FIG. 1B is a cross-sectional schematic diagram of the motherboard substrate along line A-A in FIG. 1A.

As shown in FIG. 1A and FIG. 1B, the motherboard substrate comprises a first flexible organic material layer 11 formed on a base substrate 10, a first inorganic material layer 12 formed on the first flexible organic material layer 11, and a second flexible organic material layer 13 formed on the first inorganic material layer 12. The motherboard substrate may be used for preparing a flexible display panel.

In the above-described motherboard substrate, the base substrate 10 is, for example, a rigid substrate such as glass, and may play a supporting function. The first inorganic material layer 12 completely covers the first flexible organic material layer 11, so that impurities such as water and oxygen may be isolated, so as to achieve protection effect and the like to the first flexible organic material layer 11. The second flexible organic material layer 13 exceeds the first flexible organic material layer 11 at one or more side edges (shown as a left side and a lower side in FIG. 1A), that is, orthogonal projections of one or more side edges of the second flexible organic material layer 13 on the base substrate 10 are located outside an orthogonal projection of the first flexible organic material layer 13 on the base substrate 10. For example, in the examples of FIG. 1A and FIG. 1B, the second flexible organic material layer 13 exceeds the first flexible organic material layer 11 and the first inorganic material layer 12 at one or more side edges (shown as the left side and the lower side in FIG. 1A), and is in contact with the base substrate 10.

For example, when the above-described motherboard substrate is used for preparing a display substrate, functional structures such as a pixel driving circuit and a light-emitting element layer used in a plurality of display substrates may be formed on the above-described motherboard substrate, then the first flexible organic material layer 11 and the functional structures thereon are separated from the base substrate 10, and then the motherboard substrate is cut to form a plurality of individual display substrates.

Figure 2:
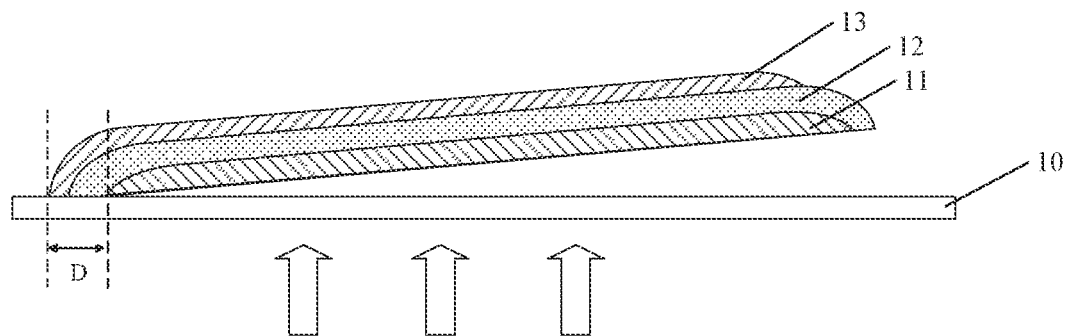
FIG. 2 is a schematic diagram of stripping off a flexible organic material layer from a base substrate in the motherboard substrate of FIG. 1A.

As shown in FIG. 2, when the first flexible organic material layer 11 and the functional structures thereon are stripped off from the base substrate 10, the first flexible organic material layer 11 may be irradiated by laser from a side of the base substrate 10, at which time, an organic material of the first flexible organic material layer 11 will be denatured, so that a bonding force between the first flexible organic material layer 11 and the base substrate 10 is reduced, and further it is easy to separate the first flexible organic material layer 11 from the base substrate 10. However, the second flexible organic material layer 13 has a portion exceeding a side edge of the first flexible organic material layer 13, that is, a portion with a width D shown in FIG. 2, so during laser irradiation, a material included in the first inorganic material layer 12 may absorb a portion of energy of laser irradiation, so that the portion of the second flexible organic material layer 13 cannot absorb enough laser energy; and accordingly, after laser irradiation, it is difficult to strip off the portion of the second flexible organic material layer 13 and the first inorganic material layer 12 as a whole from the base substrate 10; and if a relatively large force is applied to strip forcibly, wrinkles will occur on the flexible organic material layer and the display substrate will be damaged.

At least one embodiment of the present disclosure provides a display substrate motherboard and a preparation method thereof, a display substrate and a preparation method thereof. The display substrate motherboard comprises a base substrate, a first flexible organic layer on the base substrate, a first inorganic layer on the first flexible organic layer, a second flexible organic layer on the first inorganic layer, and a pixel driving circuit layer on the second flexible organic layer, the pixel driving circuit layer including a plurality of pixel driving circuit portions respectively used in a plurality of display substrates, the plurality of pixel driving circuit portions being insulated from each other; wherein, an orthogonal projection of the second flexible organic layer on the base substrate is located inside an orthogonal projection of the first inorganic layer on the base substrate, and an orthogonal projection of each pixel driving circuit portion on the base substrate is located inside the orthogonal projection of the second flexible organic layer on the base substrate. The laminate structure of the flexible organic layer and the inorganic layer of the display substrate motherboard is easily stripped off from the base substrate.

Hereinafter, the display substrate motherboard and the preparation method thereof, the display substrate and the preparation method thereof provided by the embodiments of the present disclosure will be described through several specific embodiments.

Figure 3A:
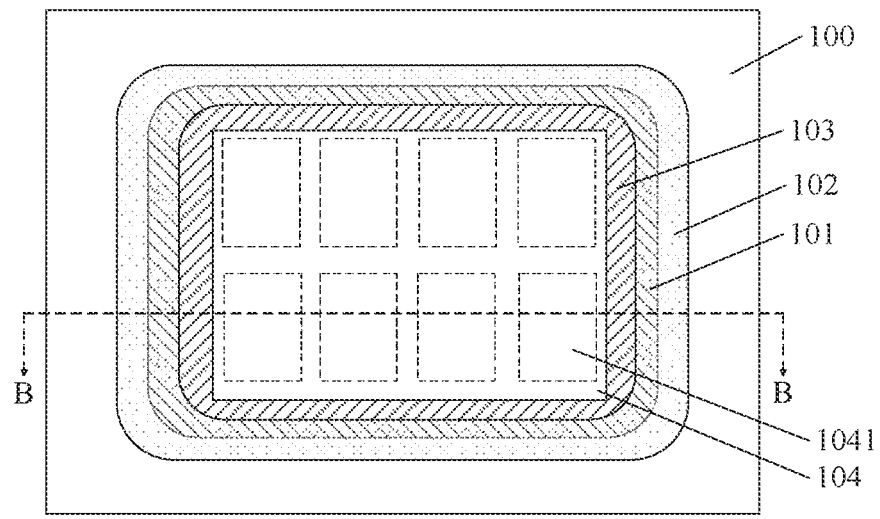
FIG. 3A is a planar schematic diagram of a display substrate motherboard provided by at least one embodiment of the present disclosure.
Figure 3B:
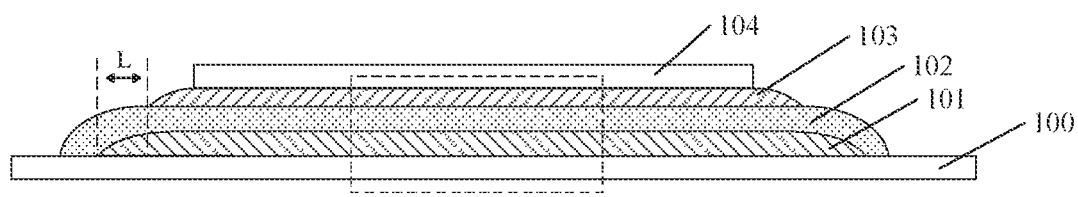
FIG. 3B is a cross-sectional schematic diagram of the display substrate motherboard along line B-B in FIG. 3A.

At least one embodiment of the present disclosure provides a display substrate motherboard, FIG. 3A shows a planar schematic diagram of the display substrate motherboard, and FIG. 3B is a cross-sectional schematic diagram of the display substrate motherboard in FIG. 3A along line B-B. As shown in FIG. 3A and FIG. 3B, the display substrate motherboard comprises a base substrate 100, a first flexible organic layer 101 on the base substrate 100, a first inorganic layer 102 on the first flexible organic layer 101, a second flexible organic layer 103 on the first inorganic layer 102 and a pixel driving circuit layer 104 on the second flexible organic layer 103, the pixel driving circuit layer 104 includes a plurality of pixel driving circuit portions 1041 respectively used for a plurality of display substrates, and the plurality of pixel driving circuit portions 1041 are insulated from each other. An orthogonal projection of the second flexible organic layer 103 on the base substrate 100 is located inside an orthogonal projection of the first inorganic layer 102 on the base substrate 100. An orthogonal projection of each pixel driving circuit portion 1041 on the base substrate 100 is located inside the orthogonal projection of the second flexible organic layer 103 on the base substrate 100.

For example, in some embodiments, the orthogonal projection of the second flexible organic layer 103 on the base substrate 100 is also located inside an orthogonal projection of the first flexible organic layer 101 on the base substrate 100.

Thus, the orthogonal projection of the second flexible organic layer 103 on the base substrate 100 does not exceed the orthogonal projection of the first inorganic layer 102 on the base substrate 100. For example, in some embodiments, the orthogonal projection of the second flexible organic layer 103 on the base substrate 100 also does not exceed the orthogonal projection of the first flexible organic layer 101 on the base substrate 100. When a laminate structure of the flexible organic layer and the inorganic layer is stripped off from the base substrate 100 by laser irradiation, only the first flexible organic layer 101 needs to fully absorb energy of laser irradiation so as to completely strip off the laminate structure of the flexible organic layer and the inorganic layer from the base substrate 100, and the stripping process is easier to perform, which may prevent defect phenomena such as wrinkles from occurring to the flexible organic layer.

For example, in some embodiments, as shown in FIG. 3B, an interval L between at least one side edge of the orthogonal projection of the second flexible organic layer 103 on the base substrate 100 and a corresponding side edge of the orthogonal projection of the first flexible organic layer 101 on the base substrate 100 (i.e., a side edge of the orthogonal projection of the first flexible organic layer 101 on the base substrate 100 that is adjacent to the at least one side edge of the orthogonal projection of the second flexible organic layer 103 on the base substrate 100) is greater than or equal to 0.2 mm, such as 0.3 mm, 0.4 mm, or 0.5 mm. For example, intervals L between all side edges of the orthogonal projection of the second flexible organic layer 103 on the base substrate 100 and corresponding side edges of the orthogonal projection of the first flexible organic layer 101 on the base substrate 100 are greater than or equal to 0.2 mm. Thus, it is ensured that the orthogonal projection of the second flexible organic layer 103 on the base substrate 100 is located inside the orthogonal projection of the first flexible organic layer 101 on the base substrate 100, to avoid a case where the second flexible organic layer 103 has a portion exceeding the first flexible organic layer 101 due to preparation errors in a preparation process.

For example, in some embodiments, as shown in FIG. 3B, the orthogonal projection of the first flexible organic layer 101 on the base substrate 100 is located inside the orthogonal projection of the first inorganic layer 102 on the base substrate 100. Thus, the first inorganic layer 102 completely covers the first flexible organic layer 101, and the first inorganic layer 102 may isolate impurities such as water and oxygen, thereby protecting the first flexible organic layer 101.

For example, in some embodiments, the base substrate 100 is a rigid substrate, such as a glass substrate. Materials of the first flexible organic layer and the second flexible organic layer are the same, and both include organic flexible materials such as polyimide (PI).

Figure 4A:
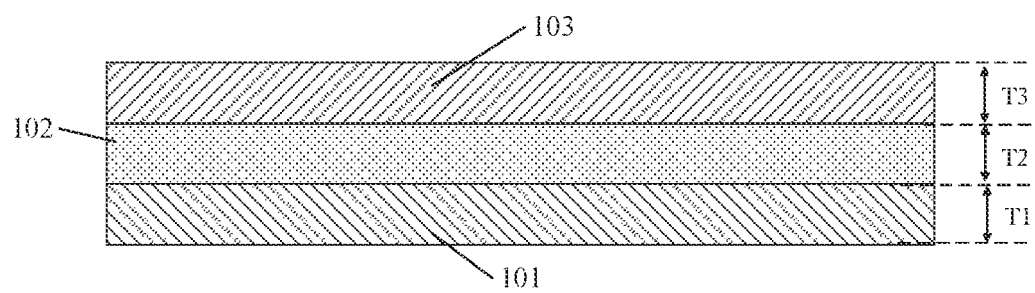
FIG. 4A is an enlarged schematic diagram of a portion of the display substrate motherboard in FIG. 3B.

FIG. 4A is an enlarged schematic diagram of a portion of a structure within a dotted frame in FIG. 3B (i.e., the first flexible organic layer 101, the first inorganic layer 102, and the second flexible organic layer 103). As shown in FIG. 4A, in some embodiments, for example, a thickness T1 of the first flexible organic layer 101 may be 5 μm to 20 μm, such as 8 μm, 10 μm, or 15 μm. A thickness T2 of the first inorganic layer 102 may be 0.4 μm to 2 μm, such as 0.5 μm, 1 μm, or 1.5 μm. A thickness T3 of the second flexible organic layer 103 may be 5 μm to 20 μm, such as 8 μm, 10 μm, or 15 μm. The thickness of the first flexible organic layer 101 and the thickness of the second flexible organic layer 103 may be the same or different. The thicknesses of the first flexible organic layer 101, the first inorganic layer 102, and the second flexible organic layer 103 will not be specifically limited in the embodiments of the present disclosure.

Figure 4B:
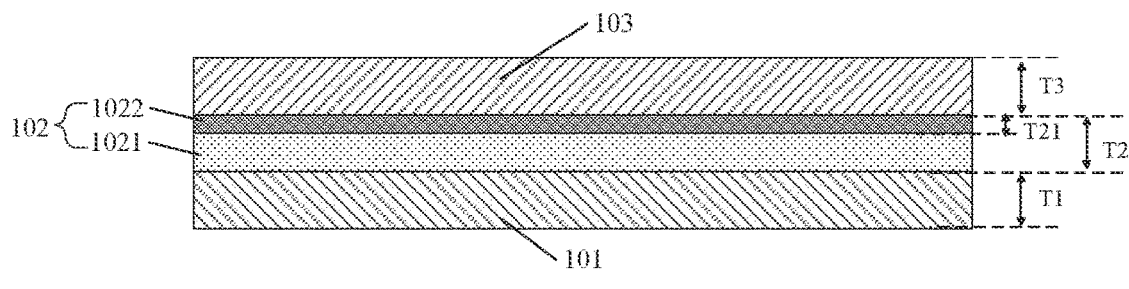
FIG. 4B is another enlarged schematic diagram of another portion of the display substrate motherboard in FIG. 3B.

For example, in some embodiments, the first inorganic layer 102 may include a laminate layer of a plurality of inorganic sub-layers. For example, FIG. 4B is another enlarged schematic diagram of the portion of the structure within the dotted frame in FIG. 3B (i.e., the first flexible organic layer 101, the first inorganic layer 102, and the second flexible organic layer 103). As shown in FIG. 4B, the first inorganic layer 102 includes a first inorganic sub-layer 1021 and a second inorganic sub-layer 1022 that are sequentially stacked on the first flexible organic layer 101; for example, a material of the first inorganic sub-layer 1021 includes an inorganic material such as silicon oxide, silicon nitride or silicon oxynitride, and a material of the second inorganic sub-layer 1022 includes an inorganic material such as amorphous silicon. The first inorganic sub-layer 1021 may implement a function of isolating impurities such as water and oxygen, and the second inorganic sub-layer 1022 may implement a function such as improving an adhesion force of the first inorganic layer 102, so as to enhance a bonding force between the first inorganic layer 102 and the second flexible organic layer 103 formed thereon.

For example, when the thickness of the first inorganic layer 102 is 0.4 μm to 2 μm, a thickness of the second inorganic sub-layer 1022 may be 1 nm to 50 nm, for example, 1 nm to 30 nm, e.g., 1 nm to 10 nm, such as 1.5 nm, 3 nm, or 5 nm. At this time, a thickness of the first inorganic sub-layer 1021 is just a thickness which is obtained after the thickness of the first inorganic layer 102 subtracts the thickness of the second inorganic sub-layer 1022. For example, in one example, the thickness of the first inorganic layer 102 is 0.5 μm, and the thickness of the second inorganic sub-layer 1022 is 30 nm, then the thickness of the first inorganic sub-layer 1021 is 0.47 μm. In other embodiments, the thicknesses of the first inorganic sub-layer 1021 and the second inorganic sub-layer 1022 may also be selected as other suitable numerical values according to specific needs, which will not be specifically limited in the embodiments of the present disclosure.

In this embodiment, only the first flexible organic layer 101 needs to fully absorb energy of laser irradiation so as to completely strip off the laminate structure of the flexible organic layer and the inorganic layer from the base substrate 100, without a situation where the first inorganic layer 102 absorbs energy of laser irradiation so that it is difficult to strip off the laminate structure of the flexible organic layer and the inorganic layer from the base substrate 100; so the first inorganic layer 102, for example, the second inorganic sub-layer 1022 in the first inorganic layer 102 may be made thicker than that in an ordinary technology, that is, the thickness of the second inorganic sub-layer 1022 may be 1 nm to 50 nm, to enhance the bonding force between the first inorganic layer 102 and the second flexible organic layer 103 formed thereon, so as to integrally improve a bonding force of the laminate structure of the organic layer and the inorganic layer on the base substrate 100.

For example, in some embodiments, according to needs, the display substrate motherboard may further comprise more flexible organic layers, for example, three or four flexible organic layers.

Figure 5:
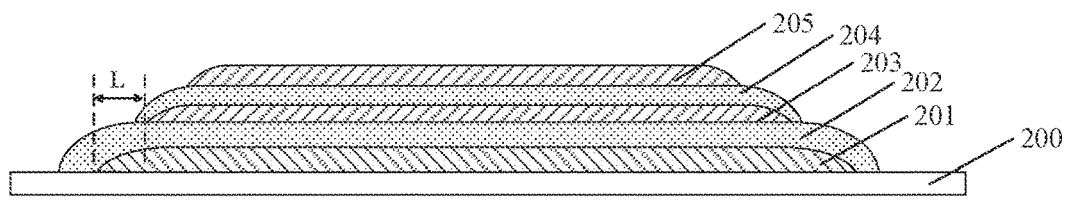
FIG. 5 is a cross-sectional schematic diagram of another display substrate motherboard provided by at least one embodiment of the present disclosure.

For example, as shown in FIG. 5, in some embodiments, a display substrate motherboard comprises three flexible organic layers. At this time, the display substrate motherboard comprises: a base substrate 200, a first flexible organic layer 201 on the base substrate 200, a first inorganic layer 202 on the first flexible organic layer 201, and a second flexible organic layer 203 on the first inorganic layer 202. An orthogonal projection of the second flexible organic layer 203 on the base substrate 200 is located inside an orthogonal projection of the first inorganic layer 202 on the base substrate 200. For example, the orthogonal projection of the second flexible organic layer 203 on the base substrate 200 is also located inside an orthogonal projection of the first flexible organic layer 201 on the base substrate 200. In addition, the display substrate motherboard further comprises: a second inorganic layer 204 on the second flexible organic layer 203, and a third flexible organic layer 205 on the second inorganic layer 204. An orthogonal projection of the third flexible organic layer 205 on the base substrate 200 is located inside the orthogonal projection of the second flexible organic layer 203 on the base substrate 200. For example, the display substrate motherboard further comprises a pixel driving circuit layer (not shown) on the third flexible organic layer 205; the above-described embodiments may be referred to for a structure and an arrangement mode of the pixel driving circuit layer, and no details will be repeated here.

For example, the orthogonal projection of the second flexible organic layer 203 on the base substrate 200 is located inside an orthogonal projection of the second inorganic layer 204 on the base substrate 200. Thus, the second inorganic layer 204 completely covers the second flexible organic layer 203, and the second inorganic layer 204 may isolate impurities such as water and oxygen, thereby protecting the second flexible organic layer 203.

For example, a thickness of the first flexible organic layer 201 may be 5 μm to 20 μm, such as 8 μm, 10 μm, or 15 μm. A thickness of the first inorganic layer 202 may be 0.4 μm to 2 μm, such as 0.5 μm, 1 μm, or 1.5 μm. A thickness of the second flexible organic layer 203 may be 5 μm to 20 μm, such as 8 μm, 10 μm, or 15 μm. A thickness of the second inorganic layer 204 may be 1 nm to 50 nm, such as 15 nm, 30 nm, or 40 nm. A thickness of the third flexible organic layer 205 may be 5 μm to 20 μm, such as 8 μm, 10 μm, or 15 μm. The thicknesses of the first inorganic sub-layer 202 and the second inorganic layer 204 may be the same or different; the thicknesses of the first flexible organic layer 201, the second flexible organic layer 203, the third flexible organic layer 205 may be the same or different; and the thicknesses of the respective layers in the display substrate motherboard will not be specifically limited in the embodiment of the present disclosure.

For example, in some embodiments, the second inorganic layer 204 may also include a plurality of inorganic sub-layers; the above-described embodiments may be referred to for materials and thicknesses of the plurality of inorganic sub-layers, and no details will be repeated here. In addition, the above-described embodiments may also be referred to for materials of the first flexible organic layer 201, the first inorganic layer 202, and the second flexible organic layer 203 and positional relationships therebetween, and no details will be repeated here.

For example, in other embodiments, the motherboard substrate may comprise more than three flexible organic layers, such as four flexible organic layers, five flexible organic layers, or six flexible organic layers. The above-described embodiments may be referred to for materials, thicknesses and position combining modes of these flexible organic layers, and no details will be repeated here.

Figure 6A:
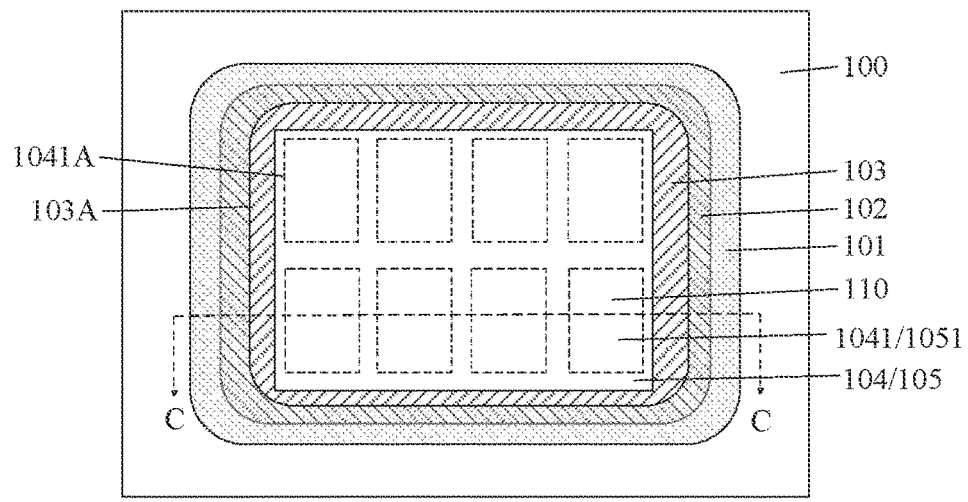
FIG. 6A is a planar schematic diagram of a display substrate motherboard provided by at least one embodiment of the present disclosure.

At least one embodiment of the present disclosure provides a display substrate motherboard; FIG. 6A is a planar schematic diagram of the display substrate motherboard; and FIG. 6B is a cross-sectional schematic diagram of the display substrate motherboard in FIG. 6A along line C-C.

Figure 6B:
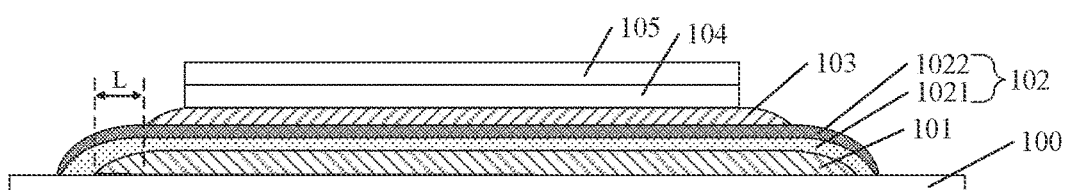
FIG. 6B is a cross-sectional schematic diagram of the display substrate motherboard along line C-C in FIG. 6A.

As shown in FIG. 6A and FIG. 6B, in addition to the structures shown in FIG. 3A and FIG. 3B, the display substrate motherboard further comprises a light-emitting element layer 105 on the pixel driving circuit layer 104; the light-emitting element layer 105 includes a plurality of light-emitting element portions 1051 respectively used for the plurality of display substrates, and the plurality of light-emitting element portions 1051 are respectively located on the plurality of pixel driving circuit portions 1041. For example, the plurality of light-emitting element portions 1051 and the plurality of pixel driving circuit portions 1041 are stacked in one-to-one correspondence relationship.

For example, an interval between a side edge 1041A of a pixel driving circuit portion located at an edge of the display substrate motherboard and a corresponding side edge 103A of the second flexible organic layer 103 is greater than or equal to 9 mm, such as 10 mm, 12 mm, or 15 mm. Thus, a cutting allowance is reserved in the display substrate motherboard, to facilitate subsequent cutting of the display substrate motherboard so as to form a plurality of display substrates.

Figure 6C:
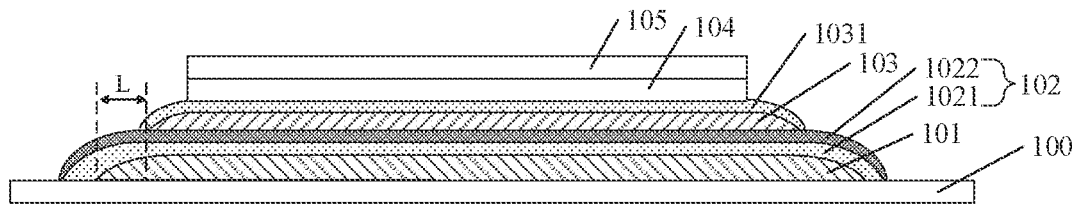
FIG. 6C is another cross-sectional schematic diagram of the display substrate motherboard along line C-C in FIG. 6A.

For example, in some embodiments, as shown in FIG. 6C, a second inorganic layer 1031 may be further provided between the second flexible organic layer 103 and the pixel driving circuit layer 104; and the second inorganic layer 1031 may include an inorganic material, for example, one or more of silicon oxide, silicon nitride, and silicon oxynitride. A thickness of the second inorganic layer may be 0.4 μm to 2 μm, such as 0.5 μm, 0.8 μm, or 1.2 μm.

For example, in the above-described display substrate motherboard, after the laminate layer of the flexible organic layer and the inorganic layer is stripped off from the base substrate, the display substrate motherboard may be cut to form a plurality of separate flexible display substrates.

Figure 10A:
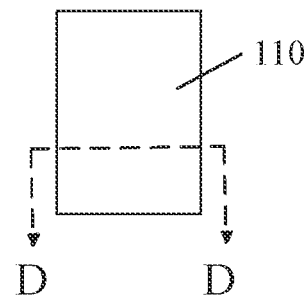
FIG. 10A is a planar schematic diagram of a display substrate provided by at least one embodiment of the present disclosure.
Figure 10B:
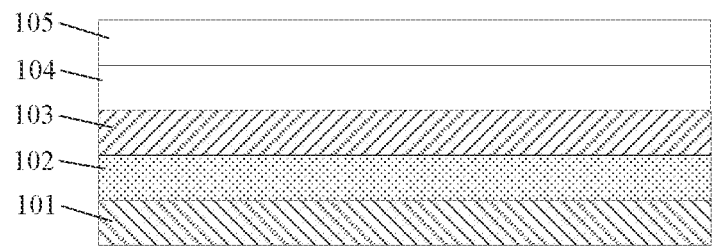
FIG. 10B is a cross-sectional schematic diagram of the display substrate along line D-D in FIG. 10A.

For example, at least one embodiment of the present disclosure further provides a display substrate; and referring to FIG. 10B, the display substrate comprises a first flexible organic layer 101, a first inorganic layer 102 on the first flexible organic layer 101, a second flexible organic layer 103 on the first inorganic layer 102, a pixel driving circuit layer 104 on the second flexible organic layer 103, and a light-emitting element layer 105 on the pixel driving circuit layer 104. A thickness of the first flexible organic layer 101 is 5 μm to 20 μm, such as 8 μm, 10 μm, or 15 μm; a thickness of the first inorganic layer 102 is 0.4 μm to 2 μm, such as 0.5 μm, 1 μm, or 1.5 μm; and a thickness of the second flexible organic layer is 5 μm to 20 μm, such as 8 μm, 10 μm, or 15 μm.

For example, the display substrate may be obtained from the above-described display substrate motherboard, for example, obtained by a stripping process and a cutting process. The display substrate may be any form of display substrate such as an Organic Light-Emitting Diode (OLED) display substrate or a Quantum Dot Light-Emitting Diode (QLED) display substrate, which will not be limited in the embodiment of the present disclosure.

Figure 7:
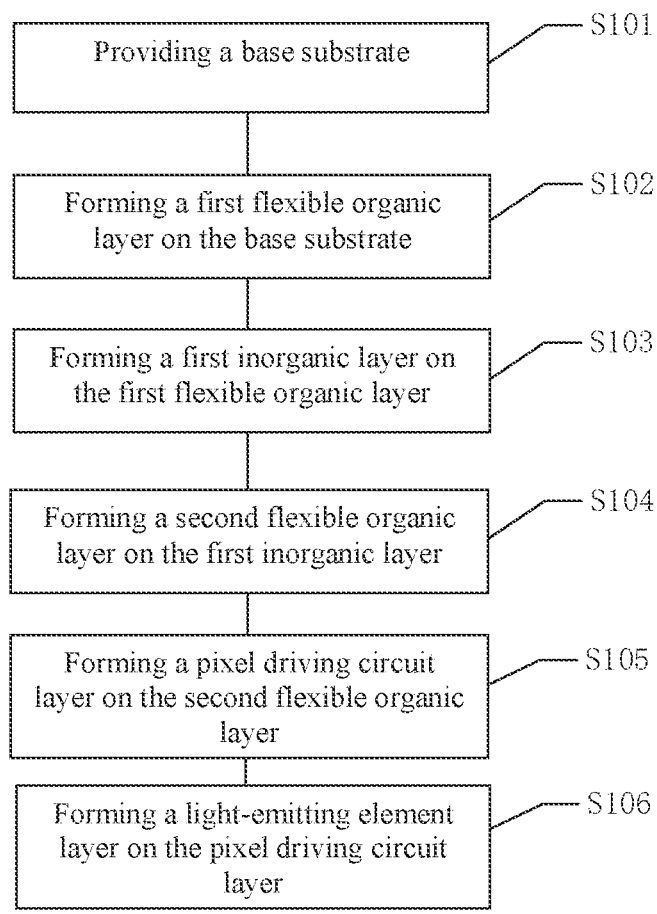
FIG. 7 is a preparation flow chart of a display substrate motherboard provided by at least one embodiment of the present disclosure.

At least one embodiment of the present disclosure further provides a preparation method of a display substrate motherboard; and FIG. 7 shows a flow chart of the preparation method. As shown in FIG. 7, the preparation method comprises steps S101 to S105.

S101: providing abase substrate.

For example, referring to FIG. 3A and FIG. 3B, the provided base substrate 100 may be a rigid substrate, such as a glass substrate.

S102: forming a first flexible organic layer on the base substrate.

For example, referring to FIG. 3A and FIG. 3B, a material of the first flexible organic layer 102 may include polyimide (PI). For example, the first flexible organic layer 102 may be formed on the base substrate 100 by coating or the like. For example, a formation thickness of the first flexible organic layer 201 is 5 μm to 20 μm, such as 8 μm, 10 μm, or 15 μm.

S103: forming a first inorganic layer on the first flexible organic layer.

For example, referring to FIG. 3A and FIG. 3B, the first inorganic layer 102 may be made of an inorganic material such as silicon oxide, silicon nitride, or silicon oxynitride. For example, the first inorganic layer 102 may be formed on the first flexible organic layer 102 by deposition or the like; and the formed first inorganic layer 102 completely covers the first flexible organic layer 102. For example, an orthogonal projection of the first flexible organic layer 101 on the base substrate 100 is located inside an orthogonal projection of the first inorganic layer 102 on the base substrate 100. For example, a formation thickness T2 of the first inorganic layer 102 is 0.4 μm to 2 μm, such as 0.5 μm, 1 μm, or 1.5 μm.

For example, in some embodiments, referring to FIG. 4B, the forming a first inorganic layer 102 includes sequentially forming a first inorganic sub-layer 1021 and a second inorganic sub-layer 1022 on the first flexible organic layer 101. For example, a material of the first inorganic sub-layer 1021 includes silicon oxide, silicon nitride, or silicon oxynitride; and a material of the second inorganic sub-layer 1022 includes amorphous silicon. For example, when a formation thickness of the first inorganic layer 102 is 0.4 μm to 2 μm, a formation thickness of the second inorganic sub-layer 1022 is 1 nm to 50 nm, and a formation thickness of the first inorganic sub-layer 1021 is equal to a thickness which is obtained after the thickness of the first inorganic layer 102 subtracts the thickness of the second inorganic sub-layer 1022.

S104: forming a second flexible organic layer on the first inorganic layer.

For example, referring to FIG. 3A and FIG. 3B, a material of the second flexible organic layer 103 may include polyimide (PI). For example, the second flexible organic layer 103 may be formed on the first inorganic layer 102 by coating or the like; and an orthogonal projection of the formed second flexible organic layer 103 on the base substrate 100 is located inside the orthogonal projection of the first inorganic layer 102 on the base substrate 100. For example, in some embodiments, the orthogonal projection of the formed second flexible organic layer 103 on the base substrate 100 is also located inside the orthogonal projection of the first flexible organic layer 101 on the base substrate 100. For example, a formation thickness of the second flexible organic layer 103 is 5 μm to 20 μm, such as 8 μm, 10 μm, or μm.

For example, in one embodiment, referring to FIG. 3B, an interval between a side edge of the orthogonal projection of the second flexible organic layer 103 on the base substrate 100 and a corresponding side edge of the orthogonal projection of the first flexible organic layer 101 on the base substrate 100 is formed to be greater than or equal to 0.2 mm, such as 0.3 mm, 0.4 mm, or 0.5 mm.

For example, in one embodiment, a pattern of the second flexible organic layer 103 may be formed by a patterning process. That is, a PI material layer is coated on the first inorganic layer 102, and then the second flexible organic layer 103 is formed by exposing and developing the PI material layer to ensure that the orthogonal projection of the second flexible organic layer 103 on the base substrate 100 is located inside the orthogonal projection of the first flexible organic layer 101 on the base substrate 100, and there is a certain interval between a side edge of the orthogonal projection of the second flexible organic layer 103 on the base substrate 100 and a corresponding side edge of the orthogonal projection of the first flexible organic layer 101 on the base substrate 100.

S105: forming a pixel driving circuit layer on the second flexible organic layer.

For example, referring to FIG. 6A and FIG. 6B, the formed pixel driving circuit layer 104 includes a plurality of pixel driving circuit portions 1041 respectively used for a plurality of display substrates; and the plurality of pixel driving circuit portions 1041 are insulated from each other. An orthogonal projection of each pixel driving circuit portion 1041 on the base substrate 100 is located inside the orthogonal projection of the second flexible organic layer 103 on the base substrate 100.

For example, each pixel driving circuit portion 1041 includes a plurality of thin-film transistors, a capacitor, a signal line, and other circuit components for driving a light-emitting element to be formed thereon. The prior art may be referred to for a specific formation manner of the pixel driving circuit layer, which will not be limited in the embodiment of the present disclosure.

In the above-described display substrate motherboard, the orthogonal projection of the second flexible organic layer 103 on the base substrate 100 is smaller than the orthogonal projection of the first inorganic layer 102 on the base substrate 100, for example, the orthogonal projection of the second flexible organic layer 103 on the base substrate 100 is also smaller than the orthogonal projection of the first flexible organic layer 101 on the base substrate 100, that is, the orthogonal projection of the second flexible organic layer 103 on the base substrate 100 does not exceed the orthogonal projection of the first flexible organic layer 101 on the base substrate 100. When the laminate structure of the flexible organic layer and the inorganic layer is stripped off from the base substrate 100 by laser irradiation, only the first flexible organic layer 101 needs to fully absorb energy of laser irradiation so as to completely strip off the laminate structure of the flexible organic layer and the inorganic layer from the base substrate 100, and the stripping process is easier to perform, which may prevent defect phenomena such as wrinkles from occurring to the flexible organic layer.

For example, in some embodiments, as shown in FIG. 7, the preparation method of the display substrate motherboard may further comprise step S106.

S106: forming a light-emitting element layer on the pixel driving circuit layer.

For example, referring to FIG. 6A and FIG. 6B, the light-emitting element layer 105 is formed on the pixel driving circuit layer 104; the light-emitting element layer 105 includes a plurality of light-emitting element portions 1051 respectively used for the plurality of display substrates; and the plurality of light-emitting element portions 1051 are respectively formed on the plurality of pixel driving circuit portions 1041. For example, the plurality of light-emitting element portions 1051 and the plurality of pixel driving circuit portions 1041 are stacked in one-to-one correspondence relationship.

For example, the light-emitting element layer 105 includes light-emitting elements used for the plurality of display substrates 100. For example, the light-emitting element may be an Organic Light-Emitting Diode (OLED), or a Quantum Dot Light-Emitting Diode (QLED), etc. The related art may be referred to for a formation mode of the light-emitting element layer 105, and the formation mode of the light-emitting element layer will not be specifically limited in the embodiment of the present disclosure.

For example, after the light-emitting element layer 105 is formed, for example, a packaging layer (not shown) may be further formed on the light-emitting element layer 105. The packaging layer may include, for example, a laminate layer of a plurality of organic packaging layers and inorganic packaging layers. A specific structure of the display substrate will not be limited in the embodiment of the present disclosure.

An embodiment of the present disclosure provides a preparation method of a display substrate; the preparation method comprising: obtaining a display substrate motherboard by using the above-described preparation method of the display substrate motherboard, separating the base substrate from the first flexible organic layer, and cutting the display substrate motherboard to form a plurality of separate display substrates.

Figure 8:
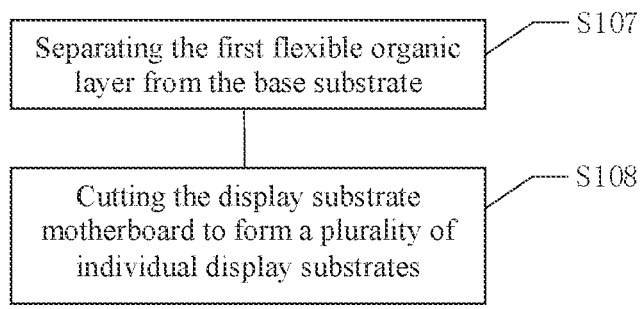
FIG. 8 is a preparation flow chart of a display substrate provided by at least one embodiment of the present disclosure.
Figure 9:
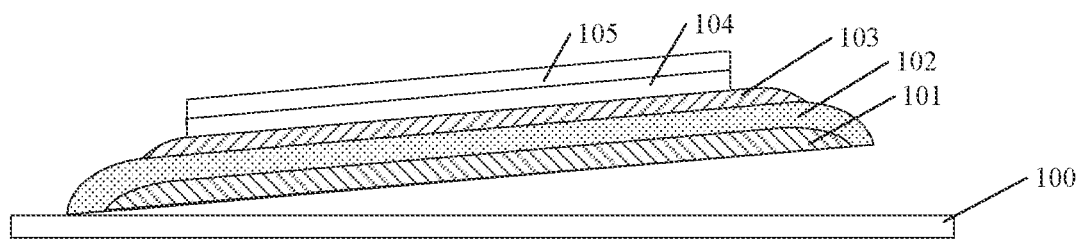
FIG. 9 is a schematic diagram of stripping off a flexible organic layer from a base substrate in the display substrate motherboard shown in FIG. 6A.

For example, FIG. 8 shows a partial flow chart of the preparation method. For example, the preparation method comprises steps S101 to S108. Steps S101 to S106 are process steps of preparing the display substrate motherboard, the above-described embodiment and FIG. 7 may be referred to for specific contents, and no details will be repeated here. Hereinafter, preparation steps after formation of the display substrate motherboard, that is, steps S107 to S108 shown in FIG. 8, will be particularly introduced.

S107: separating the first flexible organic layer from the base substrate.

For example, after functional components such as the pixel driving circuit layer and the light-emitting element layer used for the display substrate are formed, the first flexible organic layer 101 is separated from the base substrate 100.

For example, the base substrate 100 may be separated from the first flexible organic layer by using a laser lift-off manner. For example, a bottom of the base substrate is irradiated by laser, and at this time, the first flexible organic layer 101 may absorb energy of the laser, and is further denatured, thereby weakening a bonding force between the first flexible organic layer 101 and the base substrate 100. At this time, for example, a tool (e.g., a blade) may be slided between the first flexible organic layer 101 and the base substrate 100 to separate the first flexible organic layer 101 from the base substrate 100; and at this time, since the first inorganic layer 102 has a relatively small thickness and a relatively small contacting area in contact with the base substrate, when the first flexible organic layer 101 is separated from the base substrate 100, the first inorganic layer 102 is also easily separated from the base substrate 100.

S108: cutting the display substrate motherboard to form a plurality of separate display substrates.

For example, after the first flexible organic layer 101 is separated from the base substrate 100, the display substrate motherboard may be cut by using a laser cutting or the like; for example, in FIG. 6A, the display substrate motherboard is cut according to a predetermined edge of the display substrate (e.g., a dotted frame), thereby forming a plurality of separate display substrates 110, as shown in FIG. 10A. The display substrate is, for example, a flexible display substrate.

FIG. 10B is a cross-sectional schematic diagram of the display substrate along line D-D in FIG. 10A. As shown in FIG. 10B, in an individual display substrate 110 formed by cutting, respective functional layers have side edges flush with each other and thus have a regular shape.

For example, as shown in FIG. 10B, the display substrate comprises a first flexible organic layer 101, a first inorganic layer 102 on the first flexible organic layer 101, a second flexible organic layer 103 on the first inorganic layer 102, a pixel driving circuit layer 104 on the second flexible organic layer 103, and a light-emitting element layer 105 on the pixel driving circuit layer 104. A thickness of the first flexible organic layer 101 is 5 µm to 20 µm, such as 8 µm, 10 µm, or 15 µm; a thickness of the first inorganic layer 102 is 0.4 µm to 2 µm, such as 0.5 µm, 1 µm, or 1.5 µm; and a thickness of the second flexible organic layer is 5 µm to 20 µm, such as 8 µm, 10 µm, or 15 µm.

For example, the display substrate 110 may further be subjected to subsequent preparation processes, such as covering a transparent cover plate for packaging; and the subsequent preparation processes of the display substrate 110 will not be specifically limited in the embodiment of the present disclosure.

During the process of preparing the display substrate by using the above-described preparation method, since it is easy to completely strip off the first flexible organic layer 101 and the functional layers thereon from the base substrate 100, defect phenomena such as wrinkles may be prevented from occurring to the first flexible organic layer 101, which may further ensure quality of the first flexible organic layer 101 and the functional layers thereon, avoid defects such as scrapping of the display substrate, and improve yield.

For the present disclosure, the following statements should be noted:
(1) The accompanying drawings involve only the structure(s) in connection with the embodiment(s) of the present disclosure, and other structure(s) can be referred to common design(s).
(2) For the purpose of clarity only, in accompanying drawings for illustrating the embodiment(s) of the present disclosure, the thickness of a layer or a region may be enlarged or reduced, that is, the accompanying drawings are not drawn according to the actual scale.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

The invention claimed is:

1. An Organic Light-Emitting Diode display substrate, comprising:
    a first flexible organic layer;
    a first inorganic layer on the first flexible organic layer;
    a second flexible organic layer on the first inorganic layer;
    a pixel driving circuit layer on the second flexible organic layer;
    a light-emitting element layer on the pixel driving circuit layer;
    wherein a thickness of the first flexible organic layer is 5 μm-20 μm, a thickness of the first inorganic layer is 0.4 μm-2 μm, and a thickness of the second flexible organic layer is 5 μm-20 μm;
    wherein the first inorganic layer comprises a first inorganic sub-layer and a second inorganic sub-layer;
    a material of the first inorganic sub-layer comprises one or more of silicon oxide, silicon nitride or silicon oxynitride,
    wherein a thickness of the second inorganic sub-layer is 1 nm-50 nm.

2. The Organic Light-Emitting Diode display substrate according to claim 1, wherein the second inorganic sub-layer is on a side of the first inorganic sub-layer away from the first flexible organic layer.

3. The Organic Light-Emitting Diode display substrate according to claim 1, wherein a material of the second inorganic sub-layer comprises amorphous silicon.

4. The Organic Light-Emitting Diode display substrate according to claim 1, wherein a material of the first inorganic sub-layer comprises silicon oxide.

5. The Organic Light-Emitting Diode display substrate according to claim 1, wherein a thickness of the first flexible organic layer is 8 μm-10 μm.

6. The Organic Light-Emitting Diode display substrate according to claim 1, wherein a thickness of the second flexible organic layer is 5 μm-8 μm.

7. The Organic Light-Emitting Diode display substrate according to claim 1, wherein materials of the first flexible organic layer and the second flexible organic layer both include polyimide.

8. The Organic Light-Emitting Diode display substrate according to claim 1, wherein a thickness of the second inorganic sub-layer is 1 nm-30 nm.

9. The Organic Light-Emitting Diode display substrate according to claim 1, wherein a thickness of the second inorganic sub-layer is 1 nm-10 nm.

10. The Organic Light-Emitting Diode display substrate according to claim 1, wherein a thickness of the second inorganic sub-layer is 1.5 nm-3 nm.

11. The Organic Light-Emitting Diode display substrate according to claim 1, wherein a thickness of the second inorganic sub-layer is 3 nm-5 nm.

12. The Organic Light-Emitting Diode display substrate according to claim 1, wherein a thickness of the first inorganic layer is 0.4 μm-0.5 μm.

13. The Organic Light-Emitting Diode display substrate according to claim 1, wherein a thickness of the first inorganic layer is 0.5 μm-1 μm.

14. The Organic Light-Emitting Diode display substrate according to claim 1, wherein a thickness of the first flexible organic layer is 10 μm.

15. A preparation method of an Organic Light-Emitting Diode display substrate, comprising:
    manufacturing a display substrate motherboard, comprising:
        providing a base substrate;
        forming a first flexible organic layer on the base substrate;
        forming a first inorganic layer on the first flexible organic layer;
        forming a second flexible organic layer on the first inorganic layer;
        forming a pixel driving circuit layer on the second flexible organic layer, the pixel driving circuit layer including a plurality of pixel driving circuit portions respectively used for a plurality of display substrates, and the plurality of pixel driving circuit portions being insulated from each other;
    separating the first flexible organic layer from the base substrate;
    cutting the display substrate motherboard to form a plurality of individual display substrates;
    wherein a thickness of the first flexible organic layer is 5 μm-20 μm, a thickness of the first inorganic layer is 0.4 μm-1 μm, and a thickness of the second flexible organic layer is 5 μm-20 μm,
    wherein a thickness of the second inorganic sub-layer is 1 nm-50 nm.

16. The Organic Light-Emitting Diode display substrate according to claim 1, wherein a thickness of the first inorganic layer is 0.4 μm-0.5 μm.

* * * * *